United States Patent [19]

Marchywka

[11] Patent Number: 6,087,005

[45] Date of Patent: Jul. 11, 2000

[54] ADHESION OF SILICON OXIDE TO DIAMOND

[75] Inventor: Michael J. Marchywka, Lanham, Md.

[73] Assignee: The United States of America as represented by the Secretary of the Navy, Washington, D.C.

[21] Appl. No.: 08/140,388

[22] Filed: Oct. 22, 1993

[51] Int. Cl.[7] .................................................. H01L 29/66
[52] U.S. Cl. .......................... 428/408; 0257/77; 428/701; 428/702
[58] Field of Search ...................................... 428/408, 446, 428/697, 701, 702, 901, 216; 257/77

[56] References Cited

U.S. PATENT DOCUMENTS

| | | | |
|---|---|---|---|
| 5,006,203 | 4/1991 | Purdes | 423/446 |
| 5,146,481 | 9/1992 | Garg | 378/35 |
| 5,173,761 | 12/1992 | Dreifus et al. | 257/77 |
| 5,219,769 | 6/1993 | Yonehara et al. | 357/15 |
| 5,285,084 | 2/1994 | von Windheim t al. | 257/77 |

*Primary Examiner*—Archene Turner
*Attorney, Agent, or Firm*—Barry A. Edelberg; George A. Kap

[57] ABSTRACT

An article includes a diamond substrate which is securely adhered to a robust layer of silica layer that cannot be scratched by a tungsten probe or delaminated from the diamond substrate by pulling on a gold wire secured to the silica layer. This aricle can be made by electrochemically cleaning the diamond substrate to remove non-diamond carbon adhering thereto, depositing a fragile layer of silica layer which weakly bonds to the cleaned diamond, and annealing the fragile silica layer to convert it into a strongly bonded and robust silicon dioxide layer. The article is particularly useful in electronics, and has a low leakage current and low responsiveness to visible light.

5 Claims, No Drawings

ADHESION OF SILICON OXIDE TO DIAMOND

FIELD OF INVENTION

This invention pertains to the field of semiconductors and more particularly, to adhesion of silica to diamond.

BACKGROUND OF INVENTION

Electronic devices based on storage of electrons at an interface are well known. Devices containing interfaces formed by a silica ($SiO_2$) layer disposed on a silicon (Si) substrate are presently in predominant use where the silica layer is provided by controlled oxidation of the silicon substrate. Examples of other substrates in addition to silicon include gallium arsenide (GaAs) and indium phosphide (InP). The charge carrier, i.e., electrons or holes, in such devices are stored at the interfaces and it is desirable to keep leakage current in such devices to a minimum in order to minimize loss of the charge. The electronic devices of silica disposed over a silicon substrate have low leakage current. Unfortunately, the present electronic devices of silica disposed over a diamond substrate have an undesirably high leakage current which drains the charge in such devices over a period of time.

Energy band gap is important especially in optical applications for the electronic devices. The width of the band gap is the lowest energy to which the device is responsive. This means that a device with a large or a wide band gap will be responsive to a limited energy range. Since band gap of diamond is about five times that of silicon, electronic devices with diamond substrates are responsive to a more limited energy range than electronic devices with silicon substrates. Specifically, electronic devices with diamond substrates don't respond to visible light whereas electronic devices with silicon substrate are responsive to visible light.

Diamond has many desirable properties which make it especially suitable for electronic, optical and medical applications. Diamond has an energy band gap of 5.5 ev and it generates a limited number of electrons when bombarded with alpha particles, which is indicative of high radiation resistance. Attempts have been made in the past to make semiconductor electronic devices with a diamond substrate and a thin layer of silica on the diamond substrate. Electronic devices having a diamond substrate with a layer of silica thereon have many desirable attributes including reduced leakage current and reduced response to visible light. However, electronic devices of a diamond substrate with a silica coating thereon have not proven to be feasible because of poor adhesion of the silica coating to the diamond substrate and the weak or fragile coating itself, as evidenced by the fact that the silica coating on the diamond substrate can be easily scratched with a tungsten probe.

OBJECTS OF INVENTION

An object of this invention is an electronic device having a low dark current and a low response to visible light;

Another object of this invention is an electronic device comprising a diamond substrate with a robust silica coating and having a low dark current and low responsiveness to visible light; and Another object of this invention is to provide a robust coating of silica tenaciously adhering to the diamond surface.

SUMMARY OF INVENTION

These and other objects of this invention are accomplished by removing the non-diamond layer inherently formed on diamond substrates in an article comprising a diamond and a silicon dioxide layer bonded thereto. The non-diamond carbon is removed by electrochemical cleaning. This as-deposited silicon dioxide layer, which is fragile, is annealed at an elevated temperature to strengthen the silica layer and to obtain a tenacious bond between the diamond surface and the silica layer.

DETAILED DESCRIPTION OF INVENTION

The diamond substrate contemplated herein can be polycrystalline or single crystal. Preferably, however, the diamond substrate is single crystal diamond. The dimensions of the diamond substrate can vary in response to what is required. It is contemplated that surface area of the diamond substrate will generally vary from about 1 to about 10,000 $mm^2$, but is typically in the approximate range of about 5 to about 1,000 $mm^2$. Its thickness is generally in the approximate range of about 5 to about 500 microns and preferably 10 to 100 microns.

As grown diamond substrates inherently have a surface layer of non-diamond carbon. The non-diamond carbon layer typically has a thickness of about 100 to about 10,000 angstroms, and more often in the approximate range of about 200–5000 angstroms. This non-diamond carbon layer is removed during the cleaning operation described hereinafter. The non-diamond carbon layer results from the methods, such as ion implantation, CVD, etc., used to grow and stabilize diamond substrates to graphitization.

The term non-diamond carbon includes amorphous carbon. A layer of non-diamond carbon may contain, in addition to metal carbides, small amounts of other atoms such as nitrogen, argon, helium, iron, and the like.

Silicon oxides (silica) with various impurities can be used as the layer on the diamond substrate. Impurities such as nitrogen, hydroxyl ions, phosphorus and boron, can be present in the oxide of silicon. Silicon dioxide is the preferred layer on the diamond substrate. Silicon dioxide is preferred because it is a familiar material in the silicon device field and because it has a number of beneficial properties such as a large band gap, facile deposition in thin layers on the order of a few hundred angstroms, and a good dielectric strength of about $4 \times 10^6$ v/cm. It is also easily made, has good performance, is easy to pattern, and has the largest energy gap (8.8 ev) of any known stable material.

In the device of this invention, the planar dimensions of the silicon dioxide layer may or may not be coextensive with the diamond substrate. The thickness of the layer on the diamond substrate should be in the range of about 0.001–1 micron, preferably 0.04–0.1 micron. If the silica layer is too thick, it will crack and if it is too thin, it will be ineffective for purposes herein.

The cleaning step is the electrochemical removal of non-diamond carbon from the diamond surface on which silica is deposited. Electrochemical removal of the non-diamond carbon from the diamond surface results in a stable, terminated surface.

Electrochemical removal of non-diamond carbon from a diamond surface can be accomplished by immersing the diamond surface covered by the non-diamond carbon in a suitable electrolyte solution between electrodes, impressing a voltage between the electrodes to provide a sufficient electric field in the electrolyte solution to remove the non-diamond carbon, keeping the diamond surface submerged in the electrolyte solution for a sufficient duration to remove the non-diamond carbon, and removing from the electrolyte solution the diamond surface devoid of the non-diamond carbon. The electrodes may be immersed in the electrolyte solution, or positioned outside of it, provided that the diamond surface is subjected to an electric field of sufficient strength to remove the non-diamond carbon. The non-diamond carbon may be completely removed in a single electrochemical step, or over a series of electrochemical steps, each of which removes a portion of the non-diamond carbon.

Although the electric field strength required to obtain the electrochemical removal of non-diamond carbon depends on the particular electrolyte employed, electrode spacing, electrode material and its shape, thickness of the non-diamond carbon to be removed, and other considerations, the electric field in the electrolyte is typically above 1 v\cm, preferably 10 to 100 v/cm. To produce the necessary electric field in the electrolyte for a small separation of the electrodes, the impressed voltage is typically in the approximate range of 5–5000 volts, preferably 10–1000 volts.

The distance between the electrodes should be sufficient to at least accommodate the substrate(s) and obtain the required electric field strength. Electrochemical removal rates or etching rates for the non-diamond carbon are controlled by the electric field between the electrodes, increasing with either applied voltage or a decrease in electrode spacing. Spacing between electrodes is typically in the approximate range of 0.1 cm to 50 cm, preferably 0.5 cm to 20 cm.

When a portion of the diamond surface has been cleaned, i.e., the non-diamond carbon layer has been removed, the cathode can be moved to another location closer to another, uncleaned or lightly cleaned portion. Also, the diamond surface can be moved relative to the electrodes in order to obtain the desired or a more uniform electrochemical cleaning. If the diamond surface is larger than the width of electric field, the entire surface can be treated by moving one or both of the electrodes or moving the surface.

A suitable electrolyte solution has current density of about 1 to 100 ma/cm² and an impressed voltage of about 50 to 300 volts. Preferably, the electrolyte solution is a protic high resistivity liquid containing no ions that encourage graphitization of the diamond surface. For example, metal ions such as nickel, encourage graphitization and should not be included in the electrolyte solution. The resistivity of the electrolyte solution should be between about 100 ohm-centimeters and about 10 megaohm-centimeters, preferably in the approximate range of 20 ohm-cm to 5 megaohm-cm.

Especially suitable electrolyte solutions for removal of the non-diamond carbon from a diamond substrate include commercially available distilled water, which contains a small but sufficient concentration of electrolyte impurities; aqueous solutions of acids, such as chromic acid and boric acid; aqueous surfactant solutions; aqueous ammonia; and strong acids, such as sulfuric acid.

The container for the electrolyte should be sufficiently large and deep to allow the submersion of the surface to be etched in the electrolyte. Of course, the material of the container should be inert under operating conditions.

After a diamond is electrochemically cleaned and stabilized, as described above, a layer of silica or silicon dioxide is deposited on the clean diamond surface.

The method of depositing the silica layer is not critical. Typically, the silica layer may be deposited on the diamond substrate as a gas from decomposition of silane in a suitable reactor. The decomposition or reaction of silane with oxygen to produce silica occurs in accordance with the following reaction:

$$SiH_4 + O_2 \rightarrow SiO_2 + 2H_2$$

The gaseous silica is deposited on a cleaned diamond substrate which is typically at about 100 to 600° C., preferably 300 to 500° C. When gaseous silica contacts the diamond surface, it accumulates on the diamond surface and converts from a gaseous to a solid state. The thickness of the silica layer can be controlled by controlling the duration of deposition.

The deposition of a silica layer onto a cleaned diamond surface can also be accomplished by other means known to those skilled in the art. For instance, silica can also be deposited on a cleaned diamond surface by sputtering.

The as-deposited silica layer is amorphous, fragile or weak, and does not adhere tenaciously to the cleaned diamond surface. The character of the silica layer and its adhesion to the cleaned diamond surface was determined by scratching it with tungsten probe, which confirmed the fragile nature of the silica layer and its poor adhesion to the cleaned diamond surface.

In order to improve adhesion of the silica layer to the diamond and in order to render the silica layer tough or robust, the fragile silica layer deposited on the cleaned diamond surface is annealed or heat treated in a non-reactive or inert atmosphere at an elevated temperature. Annealing can be carried out in a furnace which has a nitrogen atmosphere or an atmosphere of another non-reactive gas such as argon and helium, by flowing the non-reactive gas through the furnace. Nitrogen is preferred, although any other non-reactive gas would suffice. Nitrogen is capable of forming strong bonds with both silicon and carbon, allowing it to apparently fill oxygen vacancies in the dielectric, terminate dangling carbon bonds at the interface and bridge silicon to carbon. The annealing or heat treating temperature should be high enough and the annealing duration should be long enough to render the silica layer tough and to attain a tenacious bond between the silica layer and the diamond surface on which it is deposited. Typically, the annealing temperature is in the range of about 500–1400° C., more often about 900–1200° C., and the annealing duration is in the range of about 0.1–4 hours, more often about 0.2–2 hours. In the annealing operation, care must be taken to avoid graphitization of the diamond. In an inert atmosphere, the graphitization of diamond commences at about 1200° C. The duration during which diamond is exposed to such elevated temperatures should be minimized to avoid graphitization.

The annealing operation is typically carried out by placing the unannealed electronic device in a furnace and flowing a non-reactive gas through the furnace while gradually ramping the temperature to the final anneal temperature to avoid cracking and/or other thermal dislocation in the diamond or in the silica layer. Cooling to the ambient temperature should also be gradual to avoid cracking.

After annealing, the silica layer is tough and tenaciously adheres to the diamond surface. The scratch hardness of the annealed silica layer is greater than that of tungsten. This scratch hardness may be expressed on any convenient scale, e.g., the Mohs hardness scale or an extension thereof. The toughness or hardness of the silica layer and its adhesion to the diamond substrate can be determined by scratching with a tungsten probe. Annealed silica layer cannnot be manually scratched with a tungsten probe. This test confirms the tenacious bond between the diamond surface and the silica layer and the toughness of the silica layer.

Also, gold wires of about 25 to about 150 microns in outside diameter can be secured to the silica layer and a wire pull test can be conducted to determine the silica's layer toughness and adhesion to the diamond surface. When the pull test is conducted, the gold wires break, indicating the toughness of the silica layer and its strong adhesion to the diamond surface. Annealing improves the interface quality, apparently by irreversibly passivating dangling carbon bonds. Annealing also improves the quality of the silica layer by removing oxygen vacancies and various other traps, and by removing any compensating donors in the diamond.

The final product must not only have strong adhesion between diamond and silica layer thereon and a tough silica layer, it must also have excellent electrical properties. In addition to a low dark current, low current leakage and relative unresponsiveness to visible light, the final product also has better capacity for charge storage than a comparable $Si-SiO_2$ product. The capacity for charge storage in the electronic devices disclosed herein is reflected in a low leakage current, which is about $10^{-9}$ A/cm$^2$.

The low dark current of a diamond-$SiO_2$ device disclosed herein is equal to or less than about 0.5 pA/cm$^2$ at room temperature, its leakage current is on the order of 2 nA/cm$^2$ and its responsiveness to visible light is at least 100 times less than its responsiveness to ultraviolet light. The responsiveness to visible light of a metal insulator semiconductor (MIS) device with a diamond substrate is about $10^{-3}$ times that of an MIS device with a silicon substrate.

For the prior art devices containing diamond/silica interfaces, the leakage current is about $10^{-6}$ A/cm$^2$.

The invention having been generally described, the following examples are given as particular embodiments of the invention to demonstrate the practice and advantages thereof. It is understood that the examples are given by way of illustration and are not intended to limit the specification or the claims that follow, in any manner.

EXAMPLE 1
Preparation of Silica Layer on Diamond

This example demonstrates preparation of an electronic device sample composed of a diamond substrate with a coating of silicon dioxide having reduced leakage current and reduced responsiveness to visible light.

The diamond substrate had a surface orientation of (100), was IIb or p-type, was 4 mm by 4 mm in surface area, was 250 microns thick, and had a layer of non-diamond carbon thereon which was a few monolayers thick.

The diamond substrate was electrochemically cleaned by placing the substrate in water for 20 minutes between a pair of spaced platinum electrodes biased at 200 volts. The spacing between the electrodes was 2 cm. This cleaning procedure removed the non-diamond carbon and possibly various other contaminants from the surface of the diamond substrate.

The silicon dioxide layer was then deposited by chemical vapor deposition on the cleaned diamond substrate surface from decomposition of silane in a Pyrox™ reactor in accordance with the following reaction:

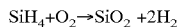

$$SiH_4+O_2 \rightarrow SiO_2 +2H_2$$

The diamond surface apparently catalyzes the reaction of silane with oxygen in the formation of silicon dioxide. The duration of the silicon dioxide deposition was 20 minutes. The diamond substrate during deposition was maintained at 400° C. The layer of silica deposited on the diamond was fragile and adhered weakly to the diamond surface, as observed by scratching the deposited layer with a tungsten probe.

The silica layer deposited on the diamond substrate was annealed in an annealing chamber under an atmosphere of flowing nitrogen. The flow of nitrogen through the annealing chamber was at 10 ft$^3$/hr. The temperature in the annealing chamber was ramped from ambient to 1100° C. over a period of 45 minutes, then reduced to 900° C. and held there for 2 hours. The silica layer on the diamond substrate was cooled to about room temperature in about 1 hour by turning off energy to the chamber.

The thickness of the annealed silica layer on the diamond substrate was 400 angstroms. The annealed silica layer disposed on the diamond substrate did not show any evidence of damage when it was scratched with a tungsten probe, indicating a tough, robust layer and a tenacious bond to the diamond substrate.

EXAMPLE 2
Adhesiveness and Toughness of Silica Layer on Diamond

The sample made in Example 1 was then sequentially rinsed in water, acetone, and isopropyl alcohol and patterned with a dot arrangement of 10 dots by 10 dots. Each dot was 150 microns and the spacing between dots was also 150 microns. Gold wires of 25.4 microns (1 mil) in outside diameter were brazed to some of the dots and then were pulled to test the character of the silica layer and the adherence of the silica layer to the diamond surface. In every instance, the wire pulled apart, indicating a robust silica layer and a tenacious bond between the silica layer and the diamond surface.

The leakage current of the sample was about 1.5×10$^{-14}$ amp at 10 volts for a 150 micron aluminum dot. This leakage current is much better, i.e., lower, by a factor of greater than 200, compared to leakage current of a comparable prior art diamond-$SiO_2$ structure. The dark current and the leakage current were comparable to an analogous prior art Si—$SiO_2$ structure.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. An article comprising a diamond devoid of a non-diamond carbon layer on at least a portion thereof and a layer of an oxide of silicon disposed on said diamond and bonded thereto, said oxide of silicon layer having an adhesiveness that is greater than the tensile strength of a gold wire of about 25 microns in outside diameter and wherein said article has a dark current that is equal to or less than about 0.5 pA/cm$^2$.

2. The article of claim 1 wherein said layer is not manually scratchable by a tungsten probe.

3. The article of claim 2 having a responsiveness to visible light of at least 100 times less than its responsiveness to ultraviolet light.

4. The article of claim 3 wherein said diamond is a single crystal diamond having a surface area of about 5 to 1,000 mm$^2$ and a thickness of about 10 to 100 microns, said oxide of silicon layer having a surface area approximately coextensive with said diamond, and said oxide of silicon layer is silicon dioxide layer.

5. The article of claim 1 that has leakage current that is less than about 10$^{-6}$ A/cm$^2$.

* * * * *